(12) United States Patent
Tahara et al.

(10) Patent No.: US 11,031,762 B2
(45) Date of Patent: Jun. 8, 2021

(54) CIRCUIT ASSEMBLY

(71) Applicants: AutoNetworks Technologies, Ltd., Mie (JP); Sumitomo Wiring Systems, Ltd., Mie (JP); Sumitomo Electric Industries, Ltd., Osaka (JP)

(72) Inventors: Hideaki Tahara, Mie (JP); Yoshikazu Sasaki, Mie (JP); Jun Ikeda, Mie (JP)

(73) Assignees: AutoNetworks Technologies, Ltd., Yokkaichi (JP); Sumitomo Wiring Systems, Ltd., Yokkaichi (JP); Sumitomo Electric Industries, Ltd., Osaka (JP)

( * ) Notice: Subject to any disclaimer, the term of this patent is extended or adjusted under 35 U.S.C. 154(b) by 23 days.

(21) Appl. No.: 16/451,416

(22) Filed: Jun. 25, 2019

(65) Prior Publication Data

US 2020/0006929 A1 Jan. 2, 2020

(30) Foreign Application Priority Data

Jun. 29, 2018 (JP) .............................. JP2018-125229

(51) Int. Cl.
| | |
|---|---|
| *H05K 1/11* | (2006.01) |
| *H05K 1/14* | (2006.01) |
| *H02G 3/16* | (2006.01) |
| *H02B 1/20* | (2006.01) |
| *H05K 7/02* | (2006.01) |
| *H05K 7/20* | (2006.01) |
| *B60R 16/02* | (2006.01) |
| *H05K 1/18* | (2006.01) |
| *H03K 17/94* | (2006.01) |
| *H01L 23/34* | (2006.01) |

(52) U.S. Cl.
CPC ............... *H02G 3/16* (2013.01); *B60R 16/02* (2013.01); *H01L 23/34* (2013.01); *H02B 1/205* (2013.01); *H03K 17/94* (2013.01); *H05K 1/14* (2013.01); *H05K 1/181* (2013.01); *H05K 7/02* (2013.01); *H05K 7/209* (2013.01)

(58) Field of Classification Search
USPC ......................................................... 361/792
See application file for complete search history.

(56) References Cited

U.S. PATENT DOCUMENTS

| | | | |
|---|---|---|---|
| 2012/0256194 A1* | 10/2012 | Yoshihara | ............... H01L 24/73 |
| 2015/0212629 A1* | 7/2015 | Chang | ................... H01R 43/20 |
| | | | 345/174 |

FOREIGN PATENT DOCUMENTS

JP 2018-082520 A 5/2018

* cited by examiner

*Primary Examiner* — Andargie M Aychillhum
(74) *Attorney, Agent, or Firm* — Honigman LLP

(57) ABSTRACT

Provided is a circuit assembly that can prevent a switching element from overheating. Included is a first conductive portion that is plate-shaped and elongated in one direction, a second conductive portion that is plate-shaped, elongated along a lengthwise direction of the first conductive portion, and is arranged to be separated from the first conductive portion by a predetermined distance, and a plurality of switching elements that are arranged straddling the first conductive portion and the second conductive portion, and are lined up in the lengthwise direction, wherein width of the first conductive portion or the second conductive portion at one end portion in the lengthwise direction is different from a width at the other end portion in the lengthwise direction.

5 Claims, 8 Drawing Sheets

CIRCUIT ASSEMBLY

CROSS-REFERENCE TO RELATED APPLICATIONS

This application claims priority of Japanese Patent Application No. JP 2018-125229 filed on Jun. 29, 2018, the contents of which are incorporated herein.

TECHNICAL FIELD

The present disclosure relates to a circuit assembly.

BACKGROUND

Vehicles are sometimes provided with circuit assemblies that are disposed in electric circuits that connect power sources and loads, the circuit assembly including two plate-shaped bus bars, a plurality of switching elements that switch the two plate-shaped bus bars between being electrically connected or disconnected, and a control element that switches the switching elements between ON and OFF (see JP 2018-082520A).

The power source and the load are electrically connected via the two bus bars and the switching elements. If the switching elements are ON, current flows from the power source to the load through the switching elements. If the switching elements are OFF, current does not flow through the switching elements and thus the connection between the power source and the load is interrupted.

SUMMARY

In the circuit assembly described above, depending on the arrangement of the bus bars and the plurality of switching elements, current may concentrate and flow through a specific switching element, and in such a case there is concern that heat generated by the switching element will increase and the switching element will overheat.

An object of the present disclosure is to provide a circuit assembly that can prevent switching elements from overheating.

A circuit assembly according to an embodiment of the present disclosure includes a first conductive portion that is plate-shaped and elongated in one direction, a second conductive portion that is plate-shaped, elongated along a lengthwise direction of the first conductive portion, and is arranged to be separated from the first conductive portion by a predetermined distance, and a plurality of switching elements that are arranged straddling the first conductive portion and the second conductive portion, and are lined up in the lengthwise direction, wherein a width of the first conductive portion or the second conductive portion at one end portion in the lengthwise direction is different from a width at the other end portion in the lengthwise direction.

The circuit assembly according to an embodiment of the present disclosure includes a first conductive portion and a second conductive portion having an identical shape and having a first portion that is elongated in one direction and a second portion that is continuous with, and intersects with, one end portion of the first portion, and a plurality of switching elements, wherein the first portions of the first conductive portion and the second conductive portion are arranged side-by-side and are separated by a predetermined distance, and the plurality of switching elements are lined up at equally spaced intervals in a lengthwise direction straddling the first portions of the first conductive portion and the second conductive portion.

With the configurations described above, it is possible to prevent the switching elements from overheating.

DETAILED DESCRIPTION OF PREFERRED EMBODIMENTS

Figure 1:
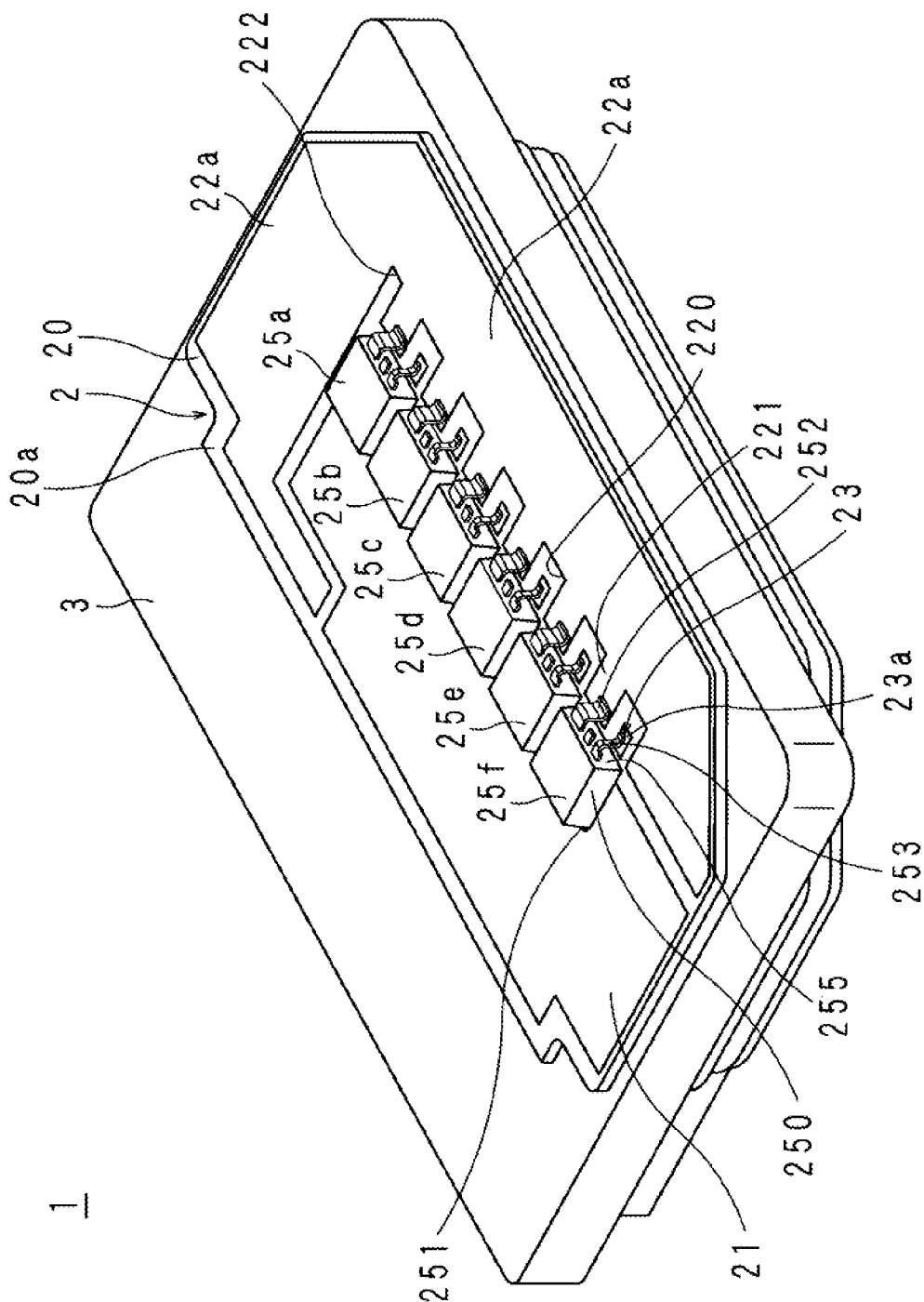
FIG. 1 is a perspective view of a circuit assembly according to a first embodiment.

The following lists and describes embodiments of the present disclosure. Also, at least some parts of the embodiments described below may also be combined as appropriate.

A circuit assembly according to an embodiment of the present disclosure includes a first conductive portion that is plate-shaped and elongated in one direction, a second conductive portion that is plate-shaped, elongated along a lengthwise direction of the first conductive portion, and is arranged to be separated from the first conductive portion by a predetermined distance, and a plurality of switching elements that are arranged straddling the first conductive portion and the second conductive portion, and are lined up in the lengthwise direction, wherein a width of the first conductive portion or the second conductive portion at one end portion in the lengthwise direction is different from a width at the other end portion in the lengthwise direction.

With this embodiment, it is possible to reduce the width through which current flows through one end or an other end in one of the first conductive portion and the second conductive portion. Thus, the resistance value can be raised in the path through which current flows through the switching element. Accordingly, the difference in the values of currents that flow through the switching element when current flows from a side with a narrow width can be made smaller, in comparison to other switching elements. Thus, is it possible to prevent the switching elements from overheating due to current concentrating in a specific switching element.

The circuit assembly according to an embodiment of the present disclosure includes a cut out portion that is provided in one end portion on the first conductive portion side in the second conductive portion, and the plurality of switching elements are lined up between the cut out portion and the other end portion.

With this embodiment, because current that flows from one end portion side of the second conductive portion does not flow through the cut out portion, the path through which current flows through the switching element that is closest to the cut out portion becomes longer than if the cut out portion were not provided. Also, the width of one end of the second conductive portion becomes smaller due to the cut out portion. Thus it becomes unlikely that the resistance value in the path will rise and current will flow therethrough, and it is thus possible to prevent the current that flows through the switching element from concentrating.

Accordingly, it is possible to reduce the size of the current that flows through the switching element that is closest to the cut out portion, and to reduce the difference between the sizes of the currents that flow through other switching elements. With the configuration described above, it is possible to prevent current from concentrating in a specific switching element and to prevent the switching elements from overheating.

In the circuit assembly according to an embodiment of the present disclosure, the cut out portion extends in a direction that is perpendicular to the lengthwise direction of the circuit assembly.

With this embodiment, it is possible to more favorably increase the resistance value in the path through which current flows through the switching element that is closest to the cut out portion, and to more favorably prevent the switching elements from overheating.

The circuit assembly according to an embodiment of the present disclosure includes the cut out portion provided along a direction in which the plurality of switching elements are lined up, on an opposite side to the second conductive portion in the first conductive portion or an opposite side to the first conductive portion in the second conductive portion, and the cut out portion becomes deeper from the other end portion toward the one end portion.

With the cut out portion in this embodiment, it is possible to progressively narrow the width through which current flows in the first conductive portion or the second conductive portion beginning from the switching element that is closest to the one end. Thus, the resistance value in the path through which current flows through the switching elements can be increased such that the closer to the one end portion, the higher the degree of increase is. Accordingly, it is possible to reduce the difference in the value of the currents that flow through the switching elements. With the configuration described above, it is possible to prevent the switching elements from overheating, which is caused by current concentrating in a specific switching element.

The circuit assembly according to an embodiment of the present disclosure includes a first conductive portion and a second conductive portion having an identical shape and having a first portion that is elongated in one direction and a second portion that is continuous with, and intersects with, one end portion of the first portion, and a plurality of switching elements, wherein the first portions of the first conductive portion and the second conductive portion are arranged side-by-side and are separated by a predetermined distance, and the plurality of switching elements are lined up at equally spaced intervals in a lengthwise direction straddling the first portions of the first conductive portion and the second conductive portion.

With this embodiment, the lengths of the paths through which current flows through the switching elements are substantially the same and the resistance values of the paths are substantially the same, and it is therefore possible to make the size of the currents that flow through the paths substantially the same. Thus, is it possible to prevent the switching elements from overheating due to current concentrating in a specific switching element.

The following specifically describes aspects of the present disclosure based on the drawings showing embodiments thereof.

First Embodiment

Figure 2:
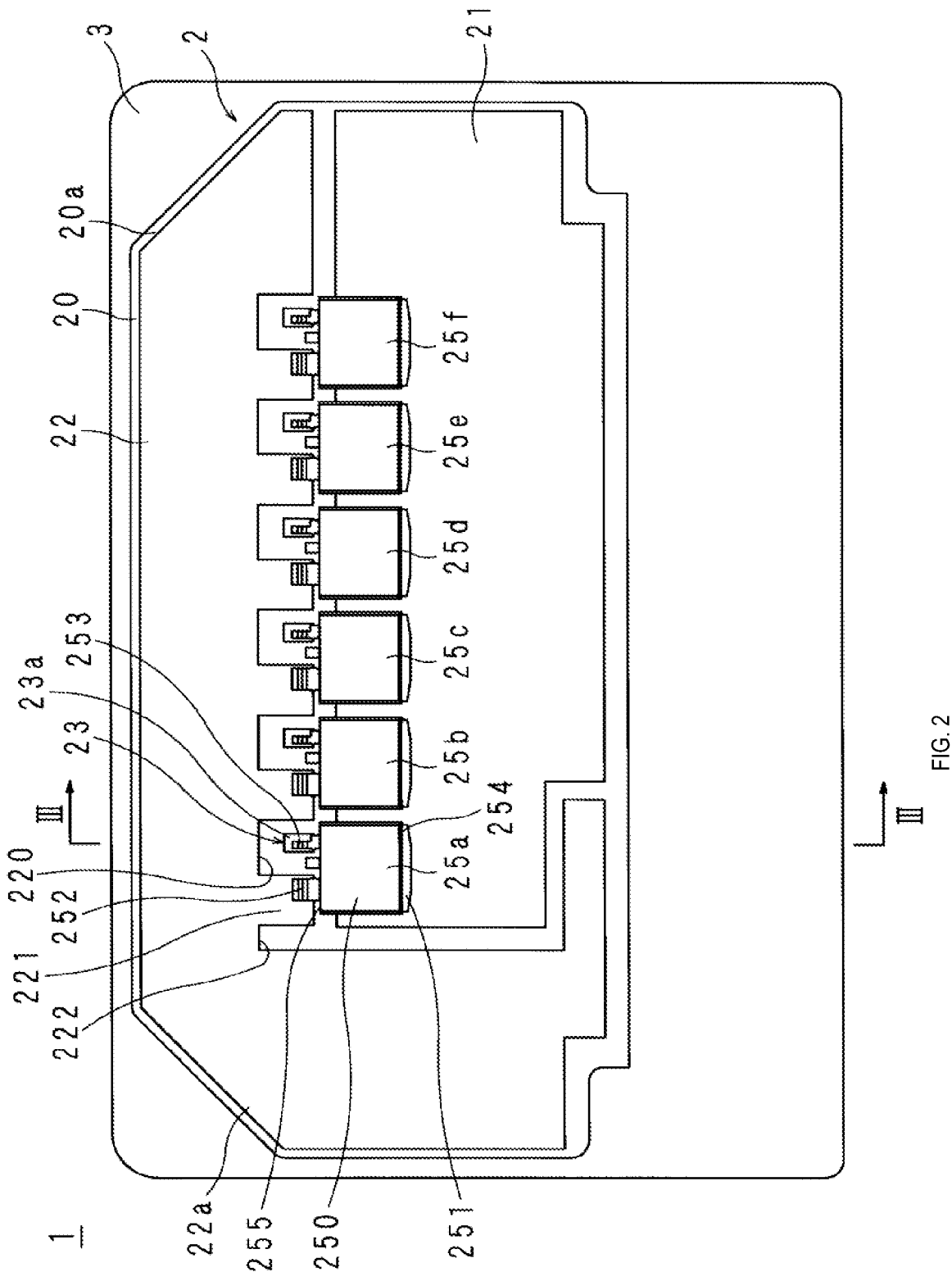
FIG. 2 is a plan view of the circuit assembly according to the first embodiment.
Figure 3:
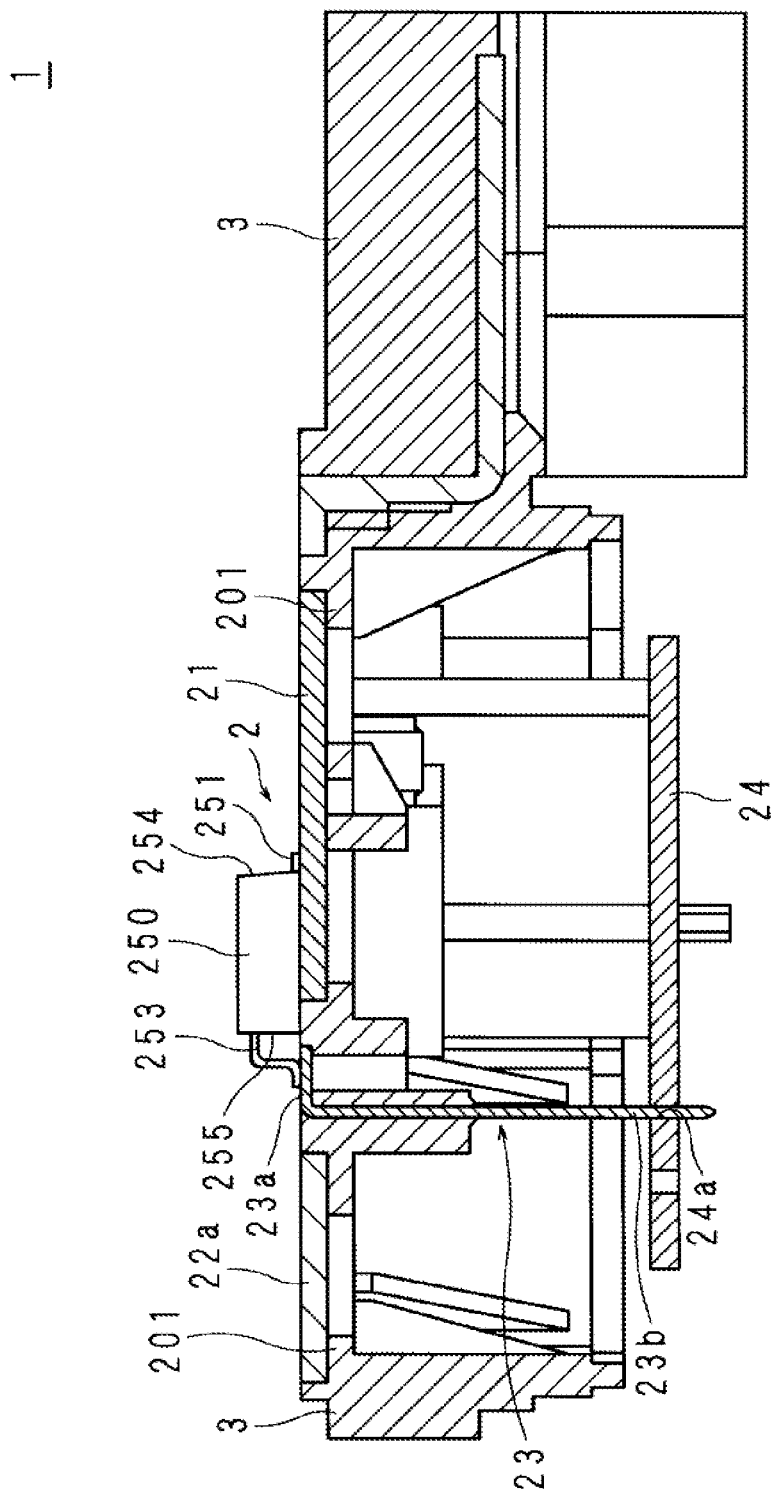
FIG. 3 is a cross-sectional view taken across line in FIG. 2.

FIG. 1 is a perspective view of a circuit assembly 1 according to the first embodiment, FIG. 2 is a plan view of the same, and FIG. 3 is a cross-sectional view taken across line in FIG. 2. The circuit assembly 1 is a part of an electrical junction box that is arranged in a power supply path between a power source such as a battery that is included in a vehicle, and a load such as a motor or an in-vehicle electronic component such as a lamp or a window wiper. The circuit assembly 1 is used as an electronic component such as a DC-DC converter or inverter.

The circuit assembly 1 includes a circuit portion 2 and a receptacle 3 that accommodates the circuit portion 2. The circuit portion 2 includes a flattened composite molding 20, a control substrate 24 that is arranged opposing the composite molding 20, and six switching elements, namely a first FET 25a, a second FET 25b, a third FET 25c, a fourth FET 25d, a fifth FET 25e, and a sixth FET 25f.

The composite molding 20 has a mounting surface 20a on which the first to sixth FETs 25a to 25f are mounted. The receptacle 3 has a frame-like body. The opening of the receptacle 3 has substantially the same shape as the exterior form of the composite molding 20, but is slightly bigger than the outer dimensions of the composite molding 20. Ribs 201 are provided on inner circumferential surfaces of the end sides of the frame in the axis direction, and protrude inwards. The composite molding 20 is placed on the ribs 201 such that the mounting surface 20a is exposed on one end side in the axis direction of the frame.

Note that the receptacle 3 and the composite molding 20 are preferably fixed with use of a well-known means such as screwing or gluing. Also, the mounting surface 20a of the composite molding 20 is preferably flush with, or higher than, the receptacle 3.

The composite molding 20 has a first bus bar 21, a second bus bar 22, and third bus bars 23, which are part of a power circuit, and is formed such that the bus bars 21 to 23 are integrated into a single body with an insulating resin material. The mounting surface 20a of the composite molding is formed to be flush therewith, and in the mounting surface 20a, the first bus bar 21, the second bus bar 22, and the third bus bar 23 are exposed. The first bus bar 21 through to the third bus bar 23 are conductive plate members that are formed from a metal material such as a copper alloy. The first bus bar 21 and the second bus bar 22 may have, for example, a thickness of about 1.0 to 2.0 mm. The third bus bars 23 may have, for example, a thickness of about 0.5 to 1.0 mm.

The first bus bar 21 is shaped as a flat plate that is elongated in one direction and positioned in the center of the mounting surface 20a of the composite molding 20. The first bus bar 21 is exposed from the mounting surface 20a of the composite molding 20 and is flush with the mounting surface 20a. The second bus bar 22 is flat and elongated in one direction. A continuous portion 22a is continuous with one end portion of the second bus bar 22, and intersects substantially perpendicular this one end portion. The continuous portion 22a is exposed from the mounting surface 20a.

The second bus bar 22 is positioned along the lengthwise direction of the first bus bar 21, separated by a predetermined distance. The continuous portion 22a is positioned along the shorter side direction of the first bus bar 21, and is separated from the first bus bar 21 by a predetermined distance.

In the first bus bar 21 side of the second bus bar 22, six recessed portions 220 are formed receding inward towards the opposite side thereof and are lined up in the lengthwise direction thereof. Also, in the second bus bar 22, a cut out portion 222 is provided at one end portion that is continuous with the continuous portion 22a. The cut out portion 222 is provided in one end portion of the second bus bar 22 on the first bus bar 21 side, and extends towards the opposite side thereof. The cut out portion 222 extends in a direction that is perpendicular to the lengthwise direction of the second bus bar 22. Also, the second bus bar 22 has six protruding portions 221 that are formed by the recessed portions 220 and the cut out portion 222.

The third bus bars 23 are plate-shaped, positioned in the recessed portions 220 in the second bus bar 22, and have exposed portions 23a that are exposed from the mounting surface 20a and extending portions 23b that extend to the side opposite from the exposed portions 23a. The extending end portions of the extending portions 23b have narrow tapered ends.

The composite molding 20 is produced through insert molding with use of an insulating resin material such as a phenol resin or a glass epoxy resin. A resin molding that is formed from an insulating resin material is joined to the first bus bar 21 through to the third bus bars 23, integrating them into a single body, and insulates the spaces between the first bus bar 21 through to the third bus bars 23 by being arranged between the first bus bar 21 through to the third bus bars 23.

The first to sixth FETs 25a to 25f may be, specifically, for example, surface-mounted type power MOSFETs mounted on the first bus bar 21 through to the third bus bars 23. In addition to the first to sixth FETs 25a to 25f, electronic components such as diodes may also be mounted on the first bus bar 21 through to the third bus bars 23.

The first to sixth FETs 25a to 25f control the conduction of the power circuit, which is constituted by the first bus bar 21 through to the third bus bars 23. In the first to sixth FETs 25a to 25f, a control signal is input from a control substrate 24 on which a control circuit is mounted, switching between conductivity and non-conductivity based on the input control signal.

Note that the example in FIGS. 1 to 3 shows a configuration in which six FETs are mounted as switching elements, but configurations are also possible in which 2 to 5, or 7 or more FETs are mounted as switching elements.

The first to sixth FETs 25a to 25f all have the same construction and each include a cuboid element 250, as well as a drain terminal 251, a source terminal 252, and a gate terminal 253 that are provided on the element 250. The drain terminals 251 are provided on first surfaces 254 of the elements 250, and the source terminals 252 and gate terminals 253 are provided on second surfaces 255 that are on the opposite side to the first surfaces 254.

The first to sixth FETs 25a to 25f are arranged straddling the first bus bar 21 and the second bus bar 22 on the mounting surface 20a, and are aligned along the lengthwise direction of the first bus bar 21 and the second bus bar 22. The first to sixth FETs 25a to 25f are lined up from the end portions of the second bus bar 22 towards the opposite direction, in the following order: first FET 25a, second FET 25b, third FET 25c, fourth FET 25d, fifth FET 25e, and sixth FET 25f. The cut out portion 222 is located in the second bus bar 22 between one end of the second bus bar 22 and the first FET 25a.

The drain terminals 251 are soldered to the exposed surface of the first bus bar 21. Also, the source terminals 252 are soldered to the protruding portions 221 of the second bus bar 22. The gate terminals 253 are soldered to the exposed portions 23a of the third bus bars 23.

The first to sixth FETs 25a to 25f are mounted on the mounting surface 20a of the composite molding 20 through a method such as reflow soldering. With reflow soldering, a solder paste is printed onto a bonding area on a substrate with use of a mask that is provided with openings that correspond to the bonding areas on the substrate, and electronic components are then placed on the solder paste. Heat is then applied to melt the solder paste, and the electronic components are thus bonded to the bonding area on the substrate. With this embodiment, the mounting surface 20a of the composite molding 20 is formed to be flush, and because there are no unnecessary protrusions on the mounting surface 20a, it is possible to apply solder paste uniformly when printing the solder paste, and it is also possible to favorably bond the terminals of the first to sixth FETs 25a to 25f to the bus bars.

The control substrate 24 may include, for example: a rectangular insulating substrate; a control circuit (not shown) including electronic components such as switching elements such as FETs that are mounted on a surface of the insulating substrate, resistors, coils, capacitors, or diodes; and a wiring pattern (not shown) that electrically connects these electronic components. On the other end in the axis direction of the receptacle 3, the control substrate 24 is arranged such that the opposite surface to the one surface face opposes the composite molding 20.

The control substrate 24 has a plurality of through holes 24a provided in correspondence with the third bus bars 23. The leading end portions of the extending portions 23b of the third bus bars 23 are inserted through the through holes 24a, the through holes 24a are then filled with a conductive material, and the extending portions 23b are thus connected to the wiring pattern. Thus, conduction can be maintained between the first to sixth FETs 25a to 25f, which are mounted on the circuit assembly 1, and a control circuit, which is mounted on the control substrate 24. Note that the length of the extending portions 23b can be appropriately set according to a specification, a desired heat resistance, and the like of the circuit assembly 1.

Figure 4A:
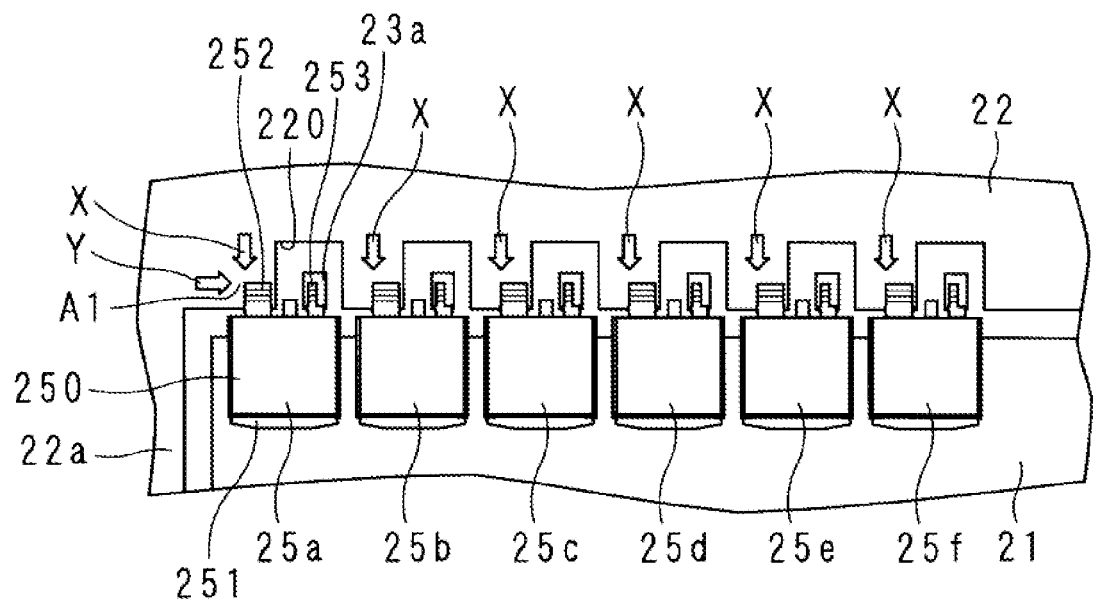
FIG. 4A is a schematic diagram illustrating the effects of a cut out portion when the cut out portion is not provided in the second bus bar.
Figure 4B:
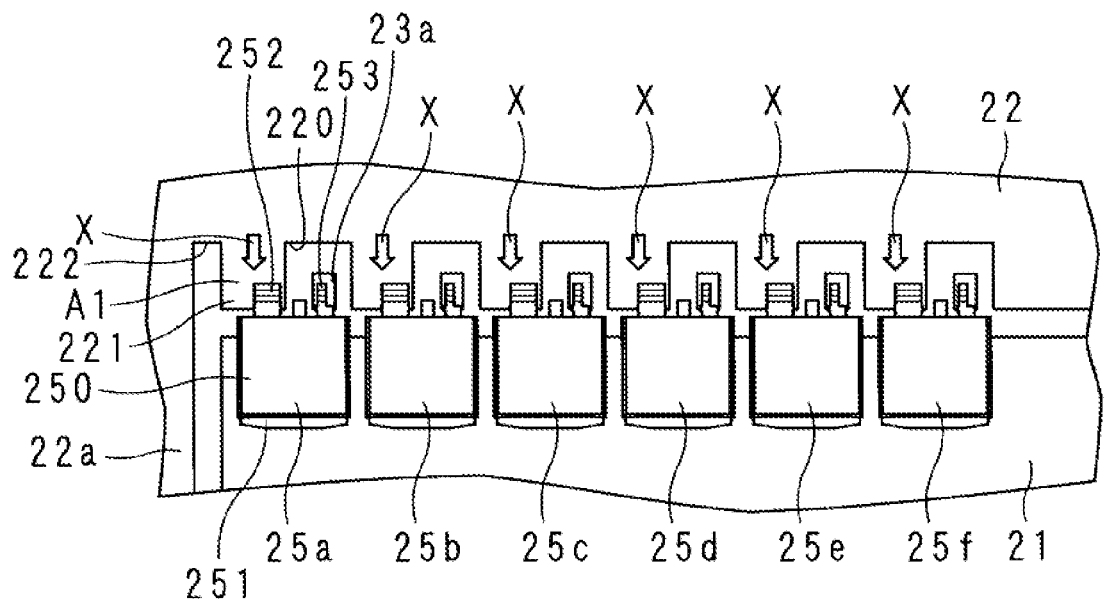
FIG. 4B is a schematic diagram illustrating the effects of a cut out portion when the cut out portion is provided in the second bus bar.
Figure 5:
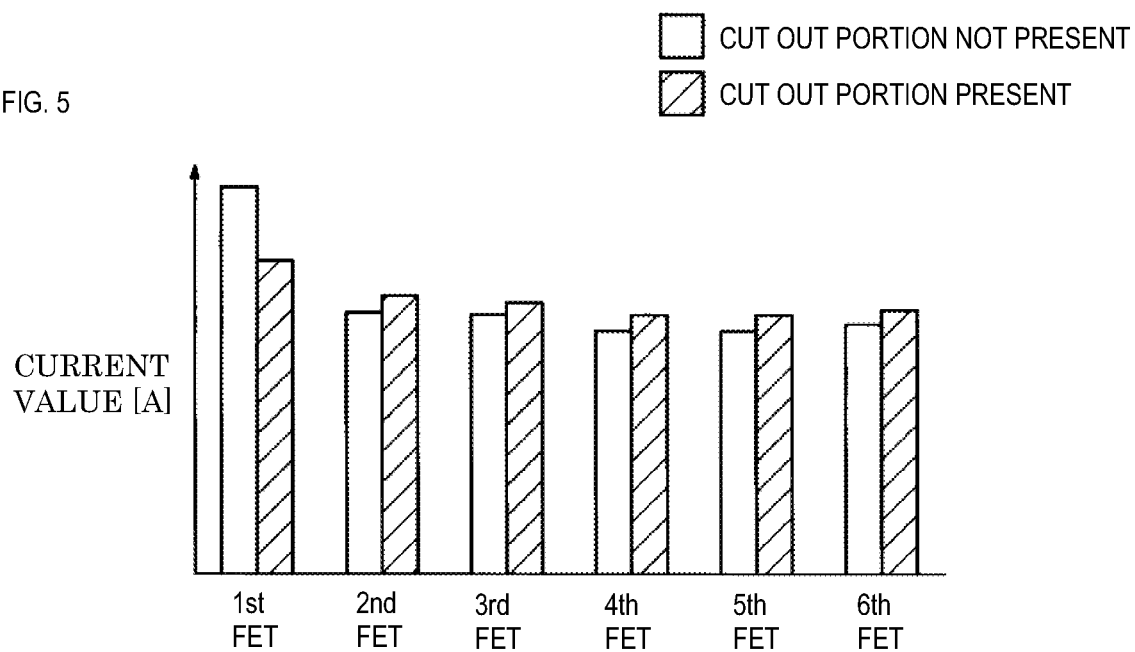
FIG. 5 is a graph showing the effects of the cut out portion.

FIG. 4 is a schematic diagram for illustrating the effects of the cut out portion 222, and FIG. 5 is a graph showing the effects of the cut out portion 222. FIGS. 4A and 4B show a case in which current flows from the protruding end side of the continuous portion 22a of the second bus bar 22 to the first bus bar 21 side. In this case, the power source is connected to the continuous portion 22a of the second bus bar 22, and the load is connected to the first bus bar 21. FIG. 4A schematically shows the flow of current if the cut out portion 222 is not provided in the second bus bar 22, and FIG. 4B schematically shows the flow of current if the cut out portion 222 is provided in the second bus bar 22. In FIG. 5, the horizontal axis shows the first to sixth FETs 25a to 25f, and the vertical axis shows the values of the currents (in amperes (A)) that flow through the FETs.

In the first to sixth FETs 25a to 25f, because the first FET 25a is closest to the one end of the second bus bar 22, the path through which current flows through the first FET 25a has the smallest resistance value among the paths that pass through the first to sixth FETs 25a to 25f if there is no cut out portion 222. Also, as shown in FIG. 4A, in a region A1 that is connected to the source terminal 252 of the first FET 25a, current flows mainly in directions X (downward in the diagram) and Y (to the right in the diagram), as indicated by the white arrows. Current flows from the X direction in the second to sixth FETs 25b to 25f. With the configuration described above, as shown in FIG. 5, the value of the current that flows through the first FET 25a is bigger than the value of the current that flows through the second to sixth FETs 25b to 25f.

Figure 6:
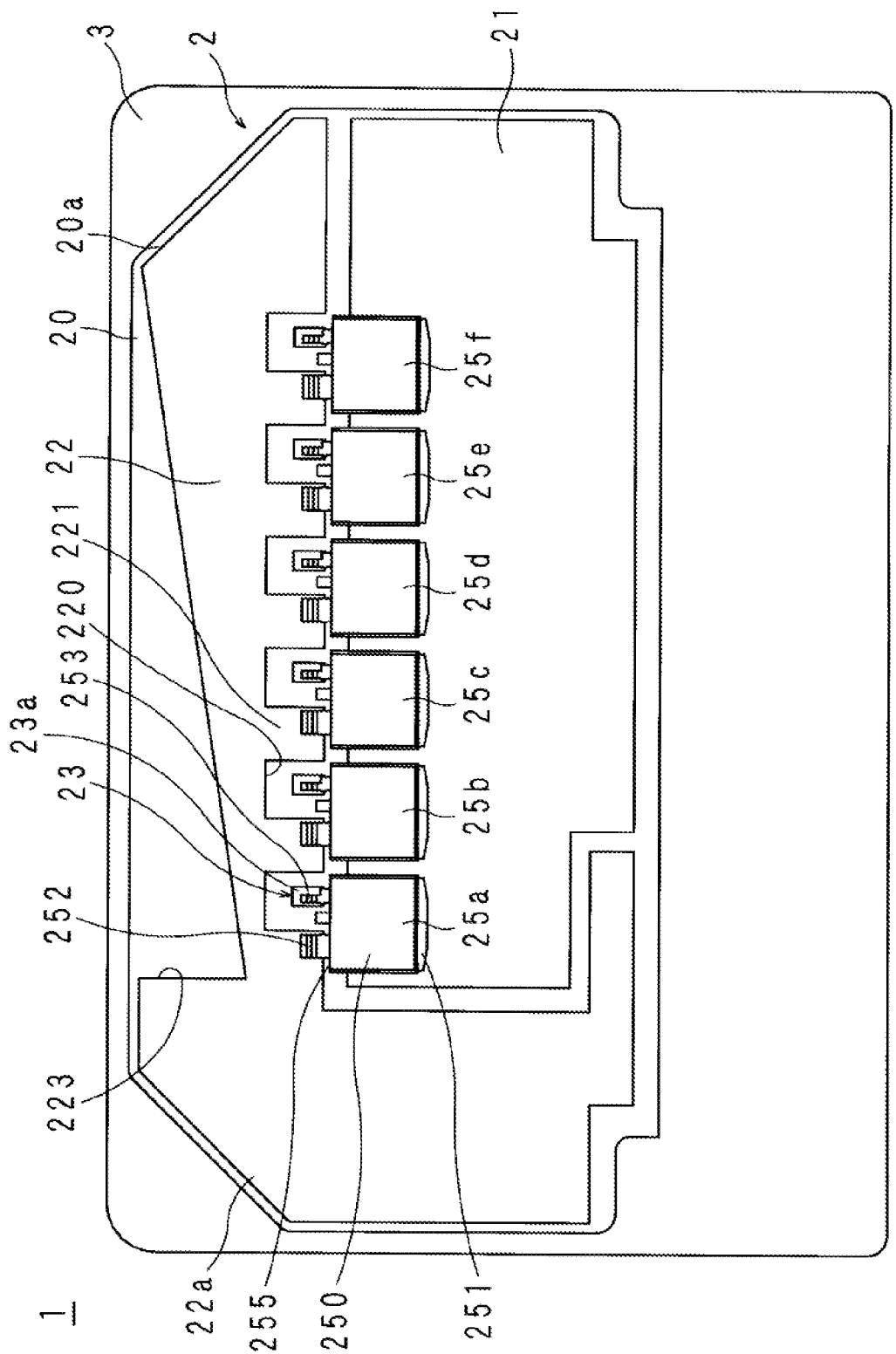
FIG. 6 is a plan view of the circuit assembly according to a second embodiment.

On the other hand, as shown in FIG. 4B, if the cut out portion 222 is provided in the second bus bar 22, current flows from the X direction to the region A1 and not from the Y direction, and thus the resistance value rises in the path that passes through the first FET 25a, and the value of the current that flows into the first FET 25a lowers as shown in FIG. 6. At this time, current that is equivalent to the lowered current value is divided and flows into the second to sixth FETs 25b to 25f. Accordingly, it is possible to reduce the difference in values of the currents that flow through all of the FETs.

With the above configuration, current that flows from one end side of the second bus bar 22 does not flow through the portion of the cut out portion 222. Also, the path through which current flows through the first FET 25a becomes longer than in a case in which the cut out portion 222 is not provided. Accordingly, the resistance value in this path is increased, lowering the current flowing therethrough, and it is therefore possible to prevent the current that flows through the first FET 25a from concentrating.

Thus, it is possible to reduce the size of the current that flows through the first FET 25a, which is closest to the cut out portion 222, and to reduce the difference between the sizes of the currents that flow through the second to sixth FETs 25b to 25f. With the above configuration, it is possible to prevent current from concentrating in a specific FET and generating heat, and it is possible to prevent the FET from overheating.

Also, the cut out portion 222 is recessed in a direction perpendicular to the lengthwise direction of the second bus bar 22. Thus, it is possible to more favorably increase the resistance value in the path through which current flows through the first FET 25a, which is closest to the cut out portion 222, and it is also possible to more favorably prevent the FETs from overheating.

Note that the cut out portion 222 may also be recessed not in the width-wise direction of the second bus bar 22, but in a direction that is inclined relative to the width-wise direction.

Also, the circuit assembly 1 may also be configured such that the power source is connected to the first bus bar 21 side, the load is connected to the second bus bar 22, and current flows from the first bus bar 21. In this case, it is similarly possible to reduce the size of the current that flows through the FET that is closest to the cut out portion 222, and to reduce the difference between the sizes of the currents that flow through the other FETs. Thus, it is possible to prevent current from concentrating in a specific FET and generating heat, and it is also possible to prevent the FETs from overheating.

Second Embodiment

In the circuit assembly according to a second embodiment, the shape of the cut out portion is different than in the first embodiment. FIG. 6 is a plan view of the circuit assembly 1 according to the second embodiment. Structures of the circuit assembly in the second embodiment that are the same as those in the first embodiment shall be given the same reference numerals and detailed descriptions thereof shall be omitted.

With the second embodiment, in the second bus bar 22, a cut out portion 223 is provided instead of the cut out portion 222. The cut out portion 223 is provided on the side opposite to the first bus bar 21 along the parallel installation direction in which the first to sixth FETs 25a to 25f are lined up, has a triangular shape, and is recessed toward the first bus bar 21 side.

The cut out portion 223 is deepest at the first FET 25a side, with the depth thereof becoming shallower towards the sixth FET 25f. Thus, the width of the second bus bar 22 becomes smaller towards the first FET 25a side.

With the above configuration, the cut out portion 223 makes it is possible for the width of the second bus bar 22 to become progressively bigger from the first FET 25a. Thus, the resistance value in the path through which current flows through the first to sixth FETs 25a to 25f can be raised such that the closer to the one end portion, the higher the degree of increase is. Accordingly, it is possible to reduce the difference between the current values that flow through the first to sixth FETs 25a to 25f. With the above configuration, it is possible to prevent current from concentrating in a specific FET and generating heat, and it is also possible to prevent the FETs from overheating.

Third Embodiment

Figure 7:
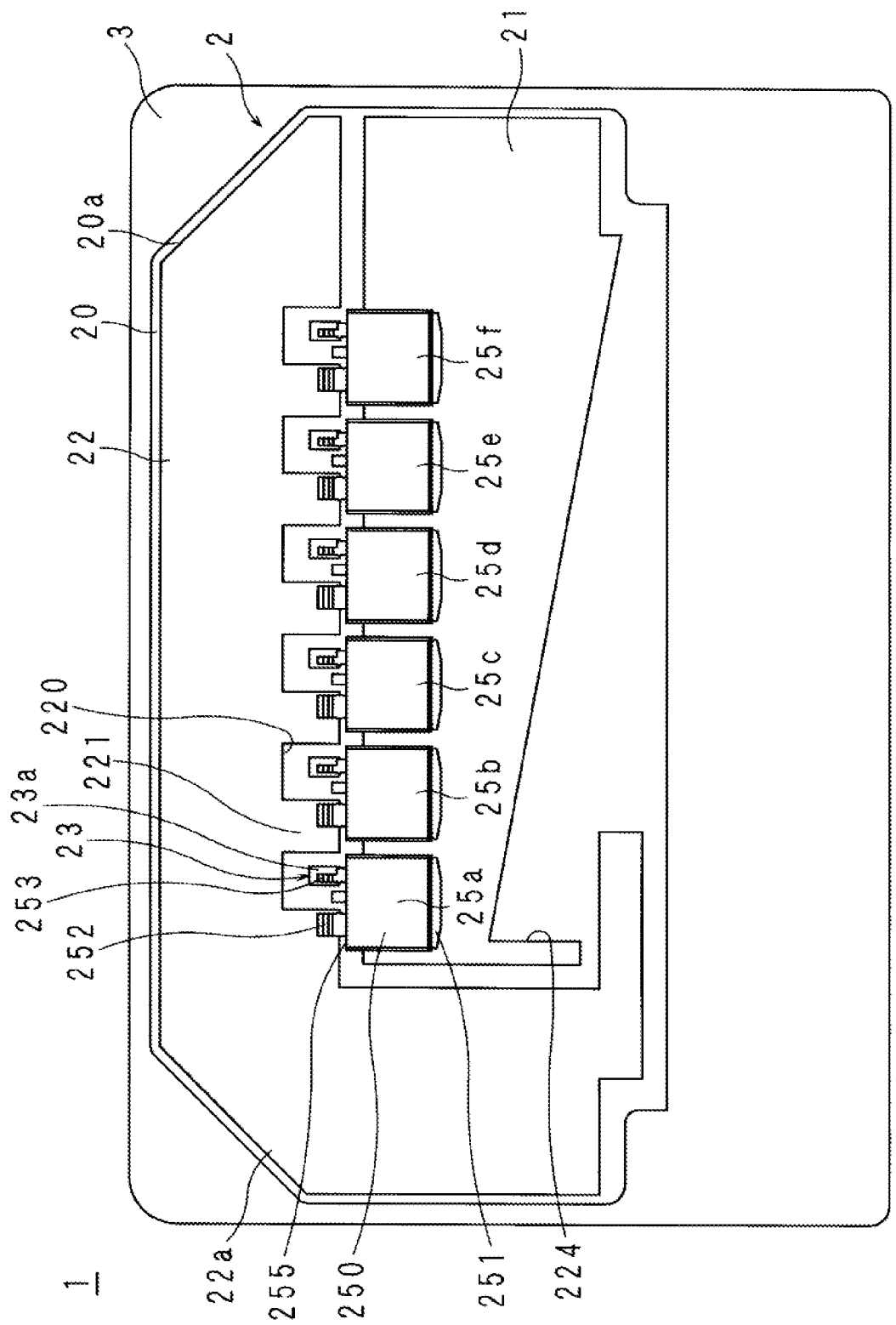
FIG. 7 is a plan view of the circuit assembly according to a third embodiment.

The shape of the first bus bar and the second bus bar in the circuit assembly according to a third embodiment are different than in the first embodiment. FIG. 7 is a plan view of the circuit assembly 1 according to the third embodiment. Structures of the circuit assembly in the third embodiment that are the same as those in the first embodiment shall be given the same reference numerals and detailed descriptions thereof shall be omitted.

With the third embodiment, instead of the cut out portion 222 being provided in the second bus bar 22, a cut out portion 224 is provided in the first bus bar 21. A cut out portion 224 is provided on the side opposite to the second bus bar 22 along the parallel installation direction of the first to sixth FETs 25a to 25f, has a triangular shape, and is recessed toward the second bus bar 22 side.

The cut out portion 224 is most deeply recessed on the first FET 25a side, and becomes less deeply recessed towards the sixth FET 25f side. Thus, the width of the first bus bar 21 becomes narrower towards the first FET 25a side.

With the above configuration, the cut out portion 224 makes it possible for the width of the first bus bar 21 to become progressively wider from the first FET 25a. Thus, the resistance value in the path through which current flows through the first to sixth FETs 25a to 25f can be raised such that the closer to the one end portion, the higher the degree of increase is. Accordingly, it is possible to reduce the difference between the current values that flow through the first to sixth FETs 25a to 25f. With the above configuration, it is possible to prevent current from concentrating in a specific FET and generating heat, and it is also possible to prevent the FETs from overheating.

Note that in the second and third embodiments, the cut out portions 223 and 224 are more deeply recessed towards the first FET 25a side, and as long as the depth of the recessed portion becomes shallower towards the sixth FET 25f side, the shape thereof is not limited to a triangle, and may also be step-shaped or any other shape.

Fourth Embodiment

Figure 8:
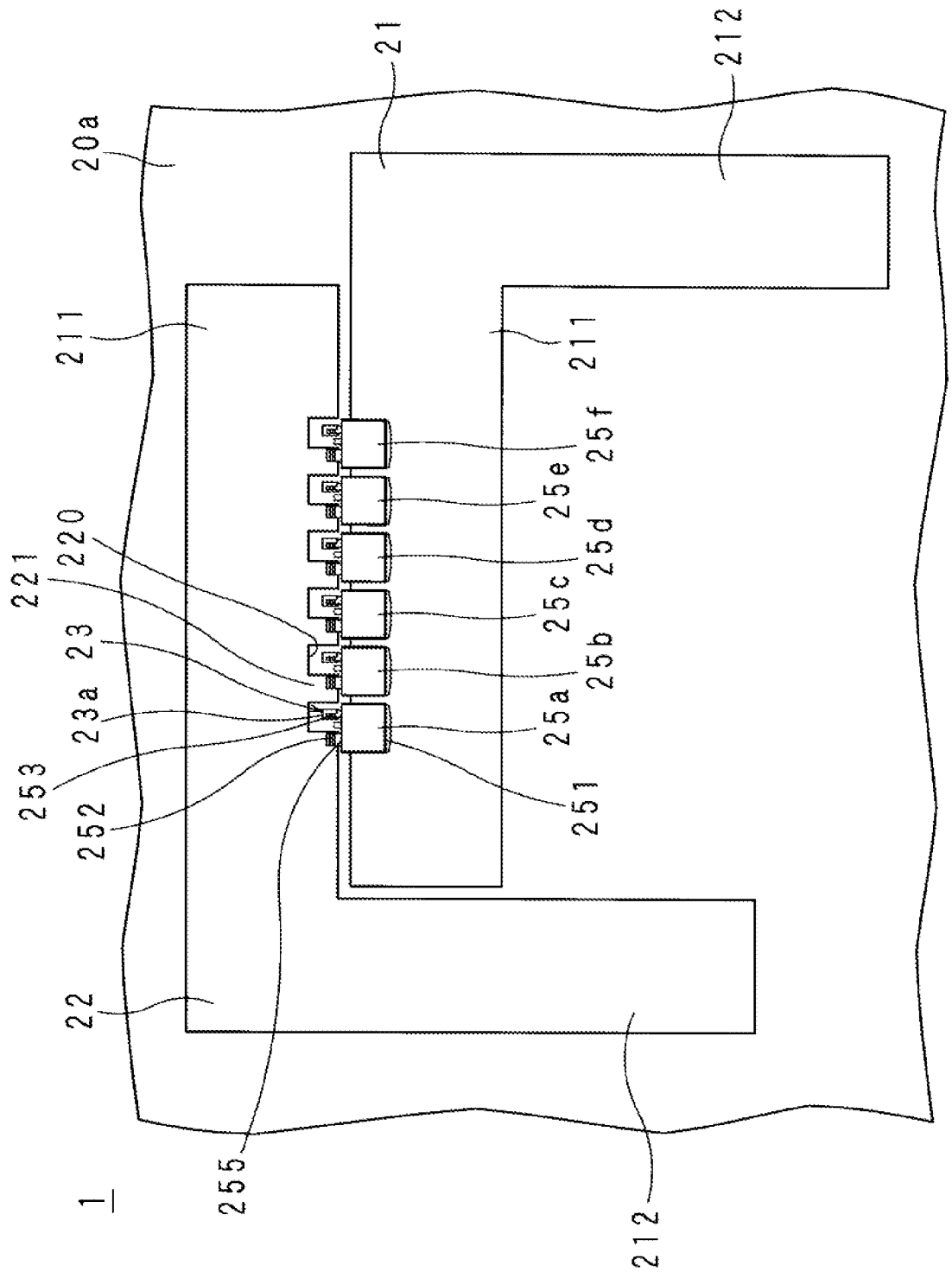
FIG. 8 is a plan view of the circuit assembly according to a fourth embodiment.

The first bus bar 21 and the second bus bar 22 of the circuit assembly according to a fourth embodiment have the same shape. FIG. 8 is a plan view of the circuit assembly 1 according to a fourth embodiment. Structures of the circuit assembly in the fourth embodiment that are the same as those in the first embodiment shall be given the same reference numerals and detailed descriptions thereof shall be omitted.

The first bus bar 21 and the second bus bar 22 in the third embodiment have the same shape, that of the letter 'L' in a plan view, and have substantially the same dimensions. The first bus bar 21 and the second bus bar 22 each have a first portion 211 that is elongated in one direction and a second portion 212 that is continuous with one end portion of the first portion 211, and intersects substantially perpendicular to the first portion 211.

The first portions 211 of the first bus bar 21 and the second bus bar 22 are aligned parallel and separated by a predetermined distance, and the second portions 212 are positioned at the same sides. Also, the first to sixth FETs 25*a* to 25*f* are lined up in equally spaced intervals.

The paths through which current flows through first FET 25*a* through to the sixth FET 25*f* have substantially the same length, and thus the resistance values of the paths can be substantially the same. Thus, the size of the currents that flow through the paths can be made substantially the same. Thus, it is possible to prevent current from concentrating in a specific switching element and generating heat, and to prevent the switching element from overheating.

The embodiments disclosed herein are examples in all respects, and are to be considered non-restrictive. The scope of the present disclosure is not limited to the meanings of the foregoing descriptions, but rather are indicated by the scope of the claims, and is intended to include all modifications within the meanings and scope that are equivalent to the claims.

What is claimed is:

1. A circuit assembly comprising:
   a first conductive portion that is plate-shaped and elongated in one direction;
   a second conductive portion that is plate-shaped, having a first portion that is elongated along a lengthwise direction of the first conductive portion, and is arranged to be separated from the first conductive portion by a predetermined distance, and a second portion orthogonal to the first portion; and
   a plurality of switching elements that are arranged straddling the first conductive portion and the second conductive portion, and are lined up in the lengthwise direction, wherein
   a cut out portion is provided between a first end portion of the first conductive portion and the second portion of the second conductive portion, and
   the plurality of switching elements are lined up between the cut out portion and a second end portion of the first conductive portion, the second end portion opposite of the first end portion.

2. The circuit assembly according to claim 1, wherein the cut out portion extends in a direction that is orthogonal to the lengthwise direction.

3. A circuit assembly comprising:
   a first conductive portion that is plate-shaped and elongated in one direction;
   a second conductive portion that is plate-shaped, having a first portion that is elongated along a lengthwise direction of the first conductive portion, and is arranged to be separated from the first conductive portion by a predetermined distance, and a second portion orthogonal to the first portion; and
   a plurality of switching elements that are arranged straddling the first conductive portion and the second conductive portion, and are lined up in the lengthwise direction;
   a cut out portion is provided between a first end portion of the first conductive portion and the second portion of the second conductive portion, wherein
   a width of the first conductive portion or the second conductive portion in the lengthwise direction widens from one end to the other and is narrowest adjacent cut out portion.

4. The circuit assembly according to claim 3, wherein the cut out portion is provided along a direction in which the plurality of switching elements are lined up, on an opposite side to the second conductive portion in the first conductive portion or an opposite side to the first conductive portion in the second conductive portion, and
   the cut out portion becomes deeper from the other end portion toward the one end portion.

5. A circuit assembly comprising:
   a first conductive portion and a second conductive portion having an identical shape and having a first portion that is elongated in one direction and a second portion that is continuous with, and intersects with, one end portion of the first portion so as to be orthogonal to the first portion; and
   a plurality of switching elements, wherein
   the first portions of the first conductive portion and the second conductive portion are arranged side-by-side and are separated by a predetermined distance, and
   the plurality of switching elements are lined up at equally spaced intervals in a lengthwise direction straddling the first portions of the first conductive portion and the second conductive portion.

\* \* \* \* \*